(12) United States Patent
Lee

(10) Patent No.: US 7,851,986 B2
(45) Date of Patent: Dec. 14, 2010

(54) LIGHT EMITTING DISPLAY MODULE INCORPORATING A PLURALITY OF PANELS AND METHOD FOR MANUFACTURING THE SAME

(75) Inventor: Il Ho Lee, Gumi-shi (KR)

(73) Assignee: LG Display Co., Ltd., Seoul (KR)

( * ) Notice: Subject to any disclaimer, the term of this patent is extended or adjusted under 35 U.S.C. 154(b) by 1105 days.

(21) Appl. No.: 11/543,144

(22) Filed: Oct. 5, 2006

(65) Prior Publication Data
US 2007/0252509 A1    Nov. 1, 2007

(30) Foreign Application Priority Data
Apr. 28, 2006    (KR) .................... 10-2006-0038678

(51) Int. Cl.
   H01L 51/52   (2006.01)
   H05B 33/08   (2006.01)
   H05B 33/06   (2006.01)
   H01L 51/50   (2006.01)
(52) U.S. Cl. .................. 313/500; 313/505; 313/512; 445/24
(58) Field of Classification Search ......... 313/500–512; 445/24, 25
See application file for complete search history.

(56) References Cited
U.S. PATENT DOCUMENTS
6,348,359 B1 *  2/2002  Van Slyke et al. ............. 438/29

FOREIGN PATENT DOCUMENTS

| EP | 1 503 422 A2 |   | 2/2005 |
|----|--------------|---|--------|
| JP | 2002328627 A | * | 11/2002 |
| JP | 2003108024 A | * | 4/2003 |
| JP | 2005274932 A | * | 10/2005 |
| JP | 2006162701 A | * | 6/2006 |

\* cited by examiner

Primary Examiner—Mariceli Santiago
(74) Attorney, Agent, or Firm—Morgan Lewis & Bockius LLP

(57) ABSTRACT

The display device module according to the present invention comprises a pixel circuit section including at least one light emitting area, each light emitting area being formed on an overlying area of a first electrode and a second electrode on a substrate; at least one first line connected to a first end portion of the first electrode; at least one first auxiliary line to a second end portion of the first electrode; at least one second auxiliary line having a connecting bar formed at one end thereof; at least one second line connected to the second electrode; and at least one dummy line having a connecting bar formed at one end thereof, the dummy line being disposed not to contact with the pixel circuit section. The display device module of the present invention further comprises a device-driving unit mounted on a mounting area adjacent to the pixel circuit section, and connected electrically to the first and second lines, or a connecting means mounted on a mounting area adjacent to the pixel circuit section and connecting an exterior device-driving unit and the pixel circuit section. The above connecting means is a film on which a device-driving unit is mounted, wherein the film is connected to the pixel circuit section via the first and second lines.

6 Claims, 3 Drawing Sheets

LIGHT EMITTING DISPLAY MODULE INCORPORATING A PLURALITY OF PANELS AND METHOD FOR MANUFACTURING THE SAME

BACKGROUND OF THE INVENTION

1. Field of the Invention

The present invention relates to a display device module and a method for manufacturing the same, particularly a display device module in which line connecting portions are formed on an area adjacent to the device, to mount a device-driving unit onto a substrate and simplify various inspections to the device, and a method for manufacturing the same.

2. Description of the Related Art

FIG. 1 is a plane view of a conventional organic electroluminescent device comprising a pixel circuit section. For convenience' sake, in the conventional organic electroluminescent device of FIG. 1, a cap is removed, and only one AA of a plurality of pixel circuit sections formed on a mother substrate is illustrated in the shape of block.

The pixel circuit section AA comprises anode electrodes formed on the mother substrate 1, an organic electroluminescent light emitting layer formed on the anode electrodes, and cathode electrodes formed on the organic electroluminescent light emitting layer.

Data lines 2A and scan lines 4A formed on the mother substrate 1 are electrically connected to the anode electrodes (not shown) and the cathode electrodes (not shown) formed in the pixel circuit section AA, respectively, end portions of the data lines 2A and the scan lines 4A are concentrated on a portion of the mother substrate 1 to form a pad P.

And, the reference numerals "4A-1" and "2A-1" not illustrated herein indicate connecting bars (so-called as "short bar") connected to ends of the scan lines 4A and the data lines 2A, and play a role to connect a plurality of scan lines 4A and a plurality of data lines 2A each other. Also, the reference numeral "S" indicates a region to which the cap will be bonded.

In a lighting inspection and an aging process carried out after manufacturing the organic electroluminescent device, a jig or pin for power supply is contacted with any one of the scan lines 4A and any one of the data lines 2A. Thus, a signal (scan signal and data signal) is transmitted to the cathode electrodes and the anode electrodes in the pixel circuit section AA through the connecting bars 4A-1 and 2a-1 and all of the scan lines 4A and the data lines 2A.

In the lighting inspection, it is possible to verify a normal lighting state of the organic electroluminescent device through the above process. Also, in the aging process, an electrical signal (reverse bias voltage) is applied to the scan lines and the data lines to stabilize the organic electroluminescent device.

After the lighting inspection and the aging process are completed, the mother substrate 1 is cut along a scribe line L to make individual organic electroluminescent devices. At this time, the connecting bars 4A-1 and 2A-1 are separated from the device.

To connect the organic electroluminescent device hereinafter, referred to as "panel") and the device-driving unit (IC chip) as shown in FIG. 1, a film equipped with the device-driving unit (IC chip) is not used, but a so-called COG (chip on glass) type of display device module in which the device-driving unit is directly mounted onto the substrate on which the pixel circuit section is formed is used.

FIG. 2 is a plane view of the COG type of organic electroluminescent device module, showing that the device-driving unit 11 is mounted onto a substrate 10.

Compared with the COF (chip on film) type of device module utilizing a film on which the device-driving unit is mounted, the COG type of device module is advantageous in that the film and electrical external connecting member do not need, and a process for connecting the film on which the device-driving unit is mounted to the panel need not be conducted.

However, in order to manufacture the COG type display device module, an area 11 for mounting the device-driving unit should be provided on the substrate 10 constituting a panel (hereinafter, the reference numeral "11" means the device-driving unit). Accordingly, due to spatial limitation, no margin area exists between the device-driving unit 11 and the scan lines 14, and between the device-driving unit 11 and the data lines 12.

That is, as shown in FIG. 2, the data lines 12 connected electrically to the pixel circuit section (the pixel circuit section is not shown in FIG. 2 by a cap, but the reference numeral "13" indicates the pixel circuit section for convenience' sake, below) can be connected directly to the device-driving unit 11. However, since there is no margin area around the device-driving unit 11, the scan lines 14 arranged on both sides of the data lines 12 are connected to an opposite portion to a portion corresponding to the pixel circuit section 13 via both sides of the device-driving unit 11.

Due to such spatial limitation, it is difficult to form the connecting bars (not shown in FIG. 2; 4A-1 and 2A-1 in FIG. 1) for connecting the scan lines 14 and the data lines 12. Also, it is extremely difficult to perform the lighting inspection and the aging process for the device in which the connecting bars are not provided.

FIG. 3 and FIG. 4 are enlarged views of "A" section of FIG. 2, and show a relation between the scan lines 14 (14-1) and the device-driving unit 11 in the COG type of organic electroluminescent device module.

On the other hand, FIG. 3 and FIG. 4 show only a part of the device-driving unit 11 and a part of the scan lines 14, 14-1. The device-driving unit 11 is transparently shown to illustrate arrangement of the scan lines 14 and 14-1

As described above, the scan lines 14 connected to an opposite portion to a portion corresponding to the pixel circuit section (13 in FIG. 2) via the sides of the device-driving unit 11 do not have a connecting bar. In this state, each end of the scan lines 14 is connected to a connecting terminal 11-1 (hereinafter, referred to as "bump") formed on the device-driving unit 11 (a state of FIG. 3).

In a different structure, a portion of each scan line 14-1 whose end is connected to a connecting bar 14A-1 may be connected to the bump 11-1 of the device-driving unit 11 (a state of FIG. 4).

As shown in FIG. 3, if the connecting bar is not formed on the scan lines 14, it is difficult to carry out the lighting inspection and the aging process for the panel.

That is, if the device-driving unit 11 is not mounted on the substrate 10, it is difficult to contact a pin or jig for inspection to all the scan lines 14 separated from each other. In particular, when a pin or jig is used, a short may be occurred by contact with adjacent scan lines disposed at a narrow interval during the lighting inspection or the aging process.

In addition, due to a jig or pin contacted with the scan line 14 formed in the shape of thin conductive layer, a scratch may be happened on the scan line 14, or the scan line 14 can be peeled from the substrate 10 (so called as "peeling phenomenon").

In order to prevent these problems, it is preferable that the lighting inspection or the aging process is carried out after the device-driving unit 11 is mounted on the substrate 10. However, it has a drawback that the expensive device-driving unit 11 should be abandoned with the panel if the inspection or the aging process determines the panel defective.

The same problem may be happened in the data lines 12 which do not have the connecting bar.

As shown in FIG. 4, in the structure that the scan lines 14-1 are connected to the connecting bar 14A-1, if a pin or jig for inspection is contacted with only one scan line 14-1, a signal is transmitted to all the scan lines 14-1 via the connecting bar 14A-1. Accordingly, although the device-driving unit 11 is not mounted onto the substrate 10, it is possible to carry out the lighting inspection and the aging process.

In this structure, however, the connecting bar 14A-1 formed on the substrate 10 should be separated from the scan lines 14-1 prior to mounting the device-driving unit 11 after completing the lighting inspection and the aging process. To do so, a laser scribing process should be additionally performed to cut the scan lines 14-1 along a scribe line L1.

In FIG. 3 and FIG. 4, the structure and arrangement of the scan lines 14 and 14-1 are described, but each data line 12 connected to the device-driving unit 11 has the same structure and function. Accordingly, the description thereon is omitted.

SUMMARY OF THE INVENTION

The present invention is conceived to solve the above problems in the display device module, an object of the present invention is to provide a display device module in which scan lines, data lines and dummy lines are effectively disposed on a narrow area of mother substrate, and a method for manufacturing the same.

Another object of the present invention is to provide a display device module to which various inspection and test processes can be easily performed utilizing the scan lines connected to each other through a connecting bar and the auxiliary lines connected to the electrodes and to each other through the connecting bar.

In order to achieve the above objects, a method for manufacturing a display device module according to the present invention comprises the steps of forming a pixel circuit section comprising at least one first electrode and one second electrode on each of at least two areas on a mother substrate divided by an imaginary scribe line; forming at least one first line connected to the first electrode of the pixel circuit section; and forming at least one second line connected to the second electrode of the pixel circuit section, wherein the second lines are connected by a connecting bar, wherein the connecting bar is formed on an area of the mother substrate outside the scribe line.

The method of the present invention further comprises the step of forming at least one third line on the mother substrate. Here, end portions of the third lines are connected to the first electrodes, and the third lines are connected to each other by a connecting bar, and the connecting bar is located at an area of the mother substrate outside the scribe line. Also, the method of the present invention further comprises the step of mounting a device-driving unit onto a mounting area of the mother substrate adjacent to the pixel circuit section. At this time, the device-driving unit is connected to the first and second lines.

The method of the present invention further comprises the step of mounting a connecting means onto a mounting area of the mother substrate adjacent to the pixel circuit section, wherein the connecting means connects the pixel circuit section and a device-driving unit. The above connecting means can be a film on which the device-driving unit is mounted, and the film is connected to a pixel circuit section through the first and second lines.

The display device module according to the present invention comprises a pixel circuit section including at least one light emitting area, each light emitting area being formed on an overlying area of a first electrode and a second electrode on a substrate; at least one first line connected to a first end portion of the first electrode; at least one first auxiliary line to a second end portion of the first electrode; at least one second auxiliary line having a connecting bar formed at one end thereof; at least one second line connected to the second electrode; and at least one dummy line having a connecting bar formed at one end thereof, the dummy line being disposed not to contact with the pixel circuit section.

The display device module of the present invention further comprises a device-driving unit mounted onto a mounting area adjacent to the pixel circuit section and connected electrically to the first and second lines, or a connecting means mounted onto the mounting area adjacent to the pixel circuit section and connecting an exterior device-driving unit and the pixel circuit section. The above connecting means is a film on which a device-driving unit is mounted, and the film is connected to the pixel circuit section via the first and second lines.

BRIEF DESCRIPTION OF THE DRAWINGS

These and other features, aspects and advantages of the present invention will become better understood with regard to the following description, appended claims, and accompanying drawings wherein;

DETAILED DESCRIPTION OF THE INVENTION

Hereinafter, preferred embodiments of the present will be described in detail with reference to the accompanying drawings. In the following embodiments, the organic electroluminescent device is illustrated as an example of the light emitting device. It is, however, cleat that the teaching of the present invention is not limited to the organic electroluminescent device.

The organic electroluminescent device (hereinafter, referred to as "panel") comprises at least one light emitting area formed by at least one anode electrode ("first electrode") formed on a substrate, an organic electroluminescent light emitting layer formed on the anode electrodes, and at least one cathode electrode ("second electrode") formed on the organic electroluminescent light emitting layer. Here, the order for forming the cathode electrodes and the anode electrodes can be changed reversely.

The substrate in the panel used for mounting the device-driving the unit can be made of various materials including conductive material and nonconductive material such as plastic film, silicon, glass and the like. The conductive material can act as transistor in the active type of organic electroluminescent device.

Figure 1:
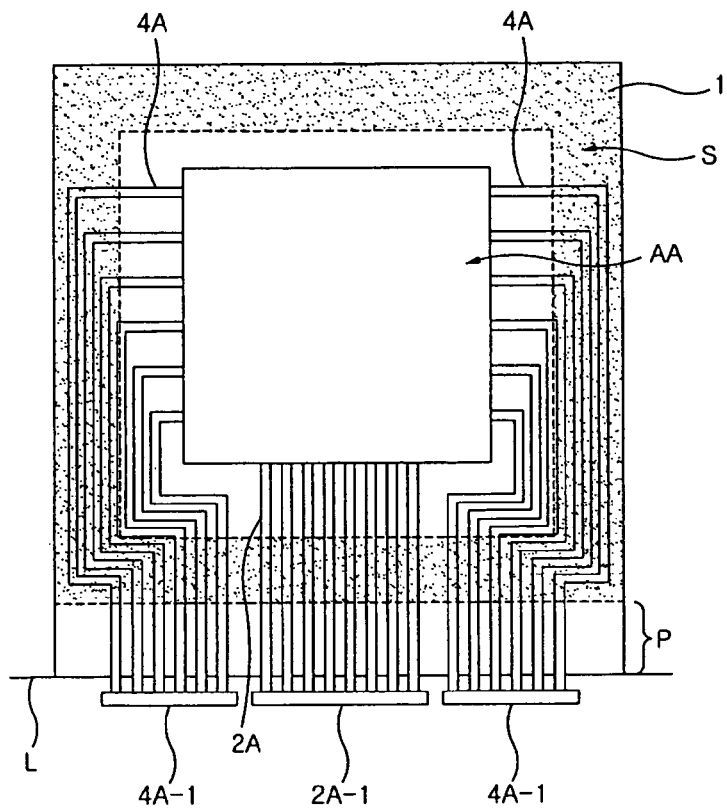
FIG. 1 is a plane view of a conventional organic electroluminescent device on which a cap is not bonded.
Figure 2:
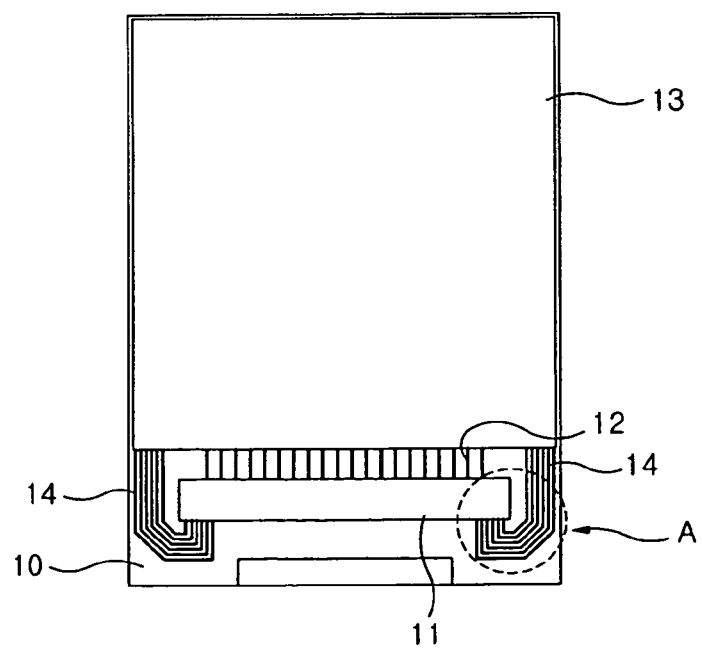
FIG. 2 is a plane view of a COG type of organic electroluminescent device module.
Figure 3:
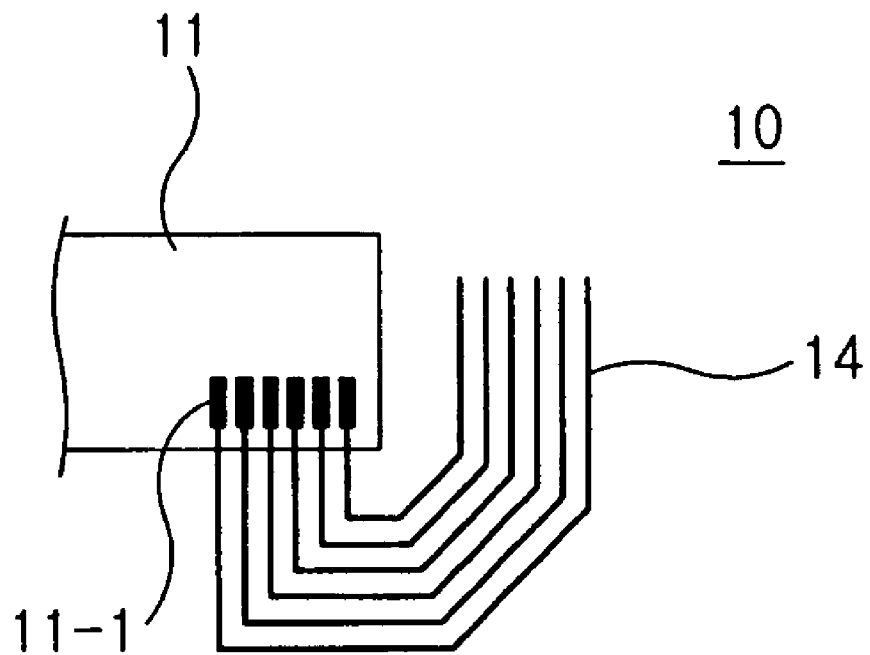
FIG. 3 and FIG. 4 are enlarged views of "A" section of FIG. 2, and show a connection relation between the scan line and the device-driving unit in the COG type of organic electroluminescent device module.
Figure 4:
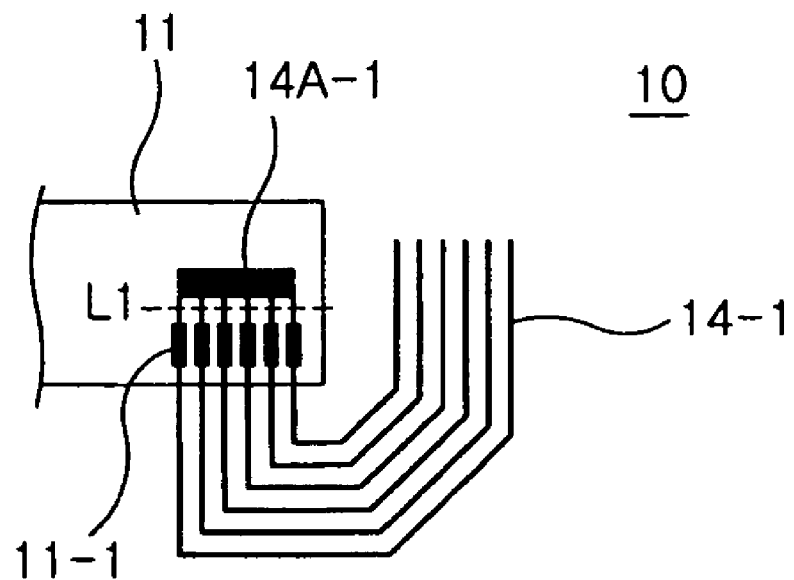
Figure 5:
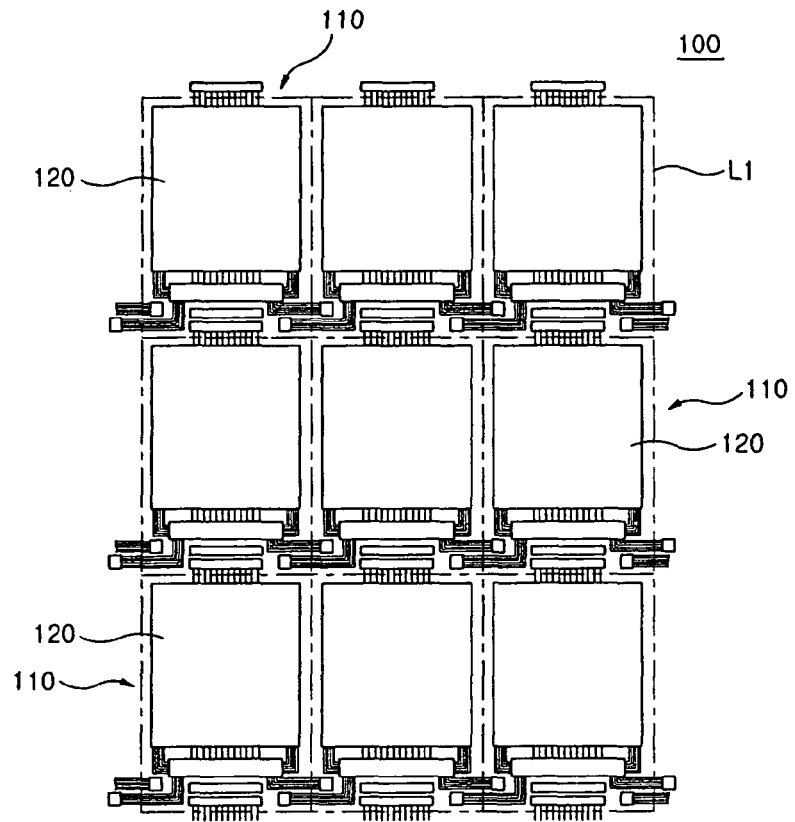
FIG. 5 is a plane view of a mother substrate according to the present invention for display device module.

FIG. 5 is a plane view of a mother substrate according to the present invention for display device module. For convenience' sake, in FIG. 5, only nine (9) organic electroluminescent devices 110 (hereinafter, referred to as "panel") are shown, and the areas on which the panels 110 are formed are defined by an imaginary scribe line L1 along which the mother substrate 100 is cut.

And, each panel 110 is an organic electroluminescent having the structure as described above. FIG. 5 shows that caps 120 are attached to cap bonding areas of the mother substrate 100 constituting the panel 110.

Figure 6:
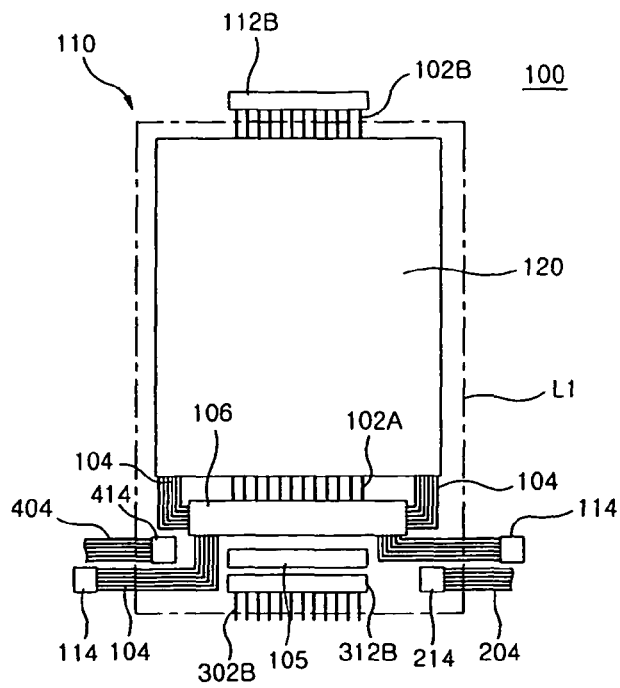
FIG. 6 is a view showing a device placed at a central area of the mother substrate and periphery portions thereof shown in FIG. 5.

FIG. 6 is a view showing one panel located at a central area of the mother substrate shown in FIG. 5, and portions of the panels disposed on periphery areas. The present invention will be described in detail with reference to the panel 110 shown in FIG. 6.

A pixel circuit section of each panel 110 consists of the structural elements including anode electrodes, organic electroluminescent light emitting layer, and anode electrodes. In FIG. 5 and FIG. 6, the pixel circuit section is not shown by a cap 120. Hereinafter, for convenience' sake, the reference numeral "120" indicates the pixel circuit section. Data lines ("first lines") 102A and scan lines ("second line") 104 each connected to one ends (first end) of the anode electrodes ("first electrode") and the cathode electrodes ("second electrodes") in the pixel circuit section 120 are disposed on a first area of the mother substrate 100 corresponding to one side of the pixel circuit section 120a.

Also, a specific area 106 is provided on an area adjacent to the pixel circuit section 120. A device-driving unit (IC chip) or a film on which the device-driving unit is mounted can be mounted onto this area 106 (hereinafter, referred to "mounting area"), and connected to the data lines 102A and the scan lines 104. A flexible circuit board mounting area 105 adjacent to the mounting area 106 can be formed for supplying electrical signal to the device-driving unit.

And, auxiliary data lines 102B are formed on a second area of the mother substrate 100 opposite to a first area on which the data lines 102A and the scan lines 104 are formed. The auxiliary data lines 102B are connected to the other ends (second ends) of the anode electrodes in the pixel circuit section 120.

The auxiliary data lines 102B pass through the imaginary scribe line L1 which is a boundary line between the adjacent panels, and extends to the substrate on which the adjacent panel is formed. An auxiliary connecting bar 112B is formed at ends of the auxiliary data lines 102B to connect the auxiliary data lines.

Also, the scan lines 104 connected to the cathode electrodes of the pixel circuit section 120 are extended to both sides of the mounting area 106. Then, the scan lines 104 pass through the mounting area 106 and the scribe line L1, and extend to the substrate on which the adjacent panels are formed. A connecting bar 114 is formed at ends of the scan lines 104 to connect the scan lines extended in the same direction.

Here, a portion of a scan line 104 corresponding to the mounting area 106 will be electrically connected to the device driving unit (or the film on which the device driving unit is mounted) mounted onto the mounting area 106 (or the film on which the device driving unit is mounted) later.

Here, locations of the scan lines 104 extended from the mounting area 106 and the connecting bars 114 (that is, a distance between the scan line and the mounting area 106) differ from those positions of the scan lines 204 and 404 extended from the mounting area of the adjacent panel and the connecting bars 214 and 414 (that is, a distance between the scan line and the mounting area 106).

Accordingly, due to the above arrangement of the scan lines, as shown in FIG. 5 and FIG. 6, the scan lines 104 formed on the substrate of any one panel are not contacted with the scan lines 204, 404 extended from the adjacent panels and the connecting bars 214, 414 formed on ends of the scan lines.

A process for manufacturing the display device module using the mother substrate 100 having the above structure will be as follows.

After a plurality of panels 110 are formed on the mother substrate 100 in the arrangement as shown in FIG. 5, without mounting the device-driving unit to the mounting area 106 of each panel 100, the lighting inspection for verifying whether each panel 100 is operated normally and the aging process in which the severe conditions are applied to the panel 110 (applying the reverse bias voltage) are carried out.

In the lighting inspection, a jig or pin for signal application is contacted with the auxiliary data lines 102B (or the auxiliary connecting bar 112B) formed outside the pixel circuit section 120 of each panel 110 and the scan lines 104 (or the connecting bar 114). At this state, an electrical signal is applied.

The applied data signal is transmitted to all the anode electrodes of the pixel circuit section 120 through the auxiliary connecting bar 112B formed at ends of the auxiliary data lines 102B and all the auxiliary data lines 102B.

Also, the applied scan signal is transmitted to all the cathode electrodes of the pixel circuit section 120 through the connecting bar 114 formed at ends of the scan lines 104 and all the scan lines 104. Accordingly, the lighting inspection is carried out by light-emitting of each area (pixel) on which the anode electrode and the cathode electrode are overlapped. In the same manner, the aging process is performed by applying extreme conditions to each pixel of the panel 110.

After the lighting inspection and the aging process for each panel 110 are completed, the mother substrate 100 is cut to carry out an individualizing process to separate each panel 110. That is, the mother substrate 100 is cut along the scribe line L1, and divided into a plurality of panels 110.

Then, the device-driving unit is mounted directly onto the mounting area 106 of each panel 110, or a connecting means for connecting the panel 110 and an exterior device-driving unit is attached onto the mounting area 106. As one example, as mentioned previously, this connecting means can be the film on which the device-driving unit is mounted. At this time, the device-driving unit or the connecting means is connected to the pixel circuit section 120 through the data lines 102A and scan lines 104.

As shown in FIG. 6, on the substrate 100 of each panel 100 separated in the above scribing process, portions of auxiliary data lines 302b ("second auxiliary data lines") and an auxiliary connecting bar 312b extended from a neighboring panel exist, and portions of the scan lines 202, 404 ("dummy scan lines") and connecting bars 214, 414 extended from another neighboring panels exist along with the data line 102A, the scan lines 104 and the auxiliary data lines ("first auxiliary data lines") 102B Since these elements 302b, 312b, 202, 404 and 214, 414 are formed on a margin area of the substrate 100 of each panel 110, they do not affect the function of the panel 110.

Here, an insulating layer can be formed on an area of each panel 110. For example, if the insulating layer is formed between the data line 102 and the scan line 104, a short from contact of the data line 102 and the scan line 104, and a leakage current may be prevented.

In particular, as shown in FIG. 6, some of the auxiliary data lines 302B extended from a neighboring panel and the auxiliary connecting bar 312B are closely adjacent to the flexible circuit board mounting area 105. Accordingly, if the insulating layer is formed on the auxiliary connecting bar 312B, there is no contact with the flexible circuit board connected to the auxiliary connecting bar 312B.

In addition, it is preferable to form a certain width of dummy area outside outermost panel, to form portions of the auxiliary data lines, the auxiliary connecting bars, portions of the scan lines, and the connecting bars, of the panel disposed on the outermost region of the mother substrate 100.

Here, although FIG. 5 and FIG. 6 show the panel 110 arranged in even-odd type that the scan lines 104 are connected to first ends of odd-numbered cathode electrodes and second ends (opposite to the first ends) of even-numbered cathode electrodes (so called as "even-odd" type arrangement), in the pixel circuit section 120, the present invention is not limited thereto. The present invention can be applied to a panel having the structure that the scan lines 104 are connected to same ends of all cathode electrodes.

The mother substrate used for forming the display device and the display device module utilizing the same according to the present invention have the following advantages.

In the mother substrate according to the present invention, in addition to the data lines connected to the device-driving unit (or the film on which the device-driving unit is mounted) mounted on the substrate, the auxiliary data lines connected to the anode electrodes of the pixel circuit section are formed, and the end portions of the auxiliary data lines are disposed on a margin area of the substrate of a neighboring panel so that the connecting bar can be formed at ends portions of the auxiliary data lines. Further, portions of the scan lines and the connecting bars formed on the end portions are disposed on a margin area of the substrate of a neighboring panel so that the scan lines can be disposed with a wide margin.

In particular, in the above configuration, the lighting inspection and the aging process for the panel can be easily carried out through the connecting bars without mounting the device-driving unit (or the film on which the device-driving unit is mounted). For reference, the device-driving unit (or the film on which the device-driving unit is mounted) is mounted to the substrate of a normal panel that passed through the lighting inspection and the aging process.

Under the above conditions, although the lighting inspection or the aging process show that the panel is defective, the expensive device-driving unit mounted onto the substrate or film itself need not be abandoned. Thus, the loss from abandoning the device-driving unit can be minimized, whereby the manufacturing cost can be reduced.

The preferred embodiments of the present invention have been described for illustrative purposes, and those skilled in the art will appreciate that various modifications, additions, and substitutions are possible, without departing from the scope and spirit of the present invention as disclosed in the accompanying claims.

What is claimed is:

1. A display device module including a plurality of panels, each of the panels, comprising
    a pixel circuit section including at least one light emitting area, each light emitting area being formed on an overlying area of a first electrode and a second electrode on a substrate;
    at least one first line connected to a first end portion of the first electrode;
    at least one first auxiliary line connected to a second end portion of the first electrode;
    at least one second auxiliary line having a connection bar formed at one end thereof;
    at least one second line connected to the second electrode; and
    at least one dummy line having a connecting bar formed at one end thereof, the dummy line being disposed not to contact with the pixel circuit section and other lines,
    wherein the at least one second auxiliary line is extended from the connection bar and is connected with a first electrode of a neighboring panel.

2. The display device module of claim 1, further comprising a device-driving unit mounted on a mounting area adjacent to the pixel circuit section and connected electrically to the first and second lines.

3. The display device module of claim 2, wherein the second line is extended through at least one side of the device-driving unit.

4. The display device module of claim 1, further comprising a connecting means mounted to a mounting area adjacent to the pixel circuit section, and connecting an exterior device-driving unit and the pixel circuit section.

5. The display device module of claim 4, wherein the connecting means is a film on which a device-driving unit is mounted, wherein the film is connected to the pixel circuit section via the first and second lines.

6. The display device module of claim 1, wherein the pixel circuit section comprises at least one anode electrode formed on the substrate, an organic light-emitting layer formed on the anode electrode, and at least one cathode electrode formed on the organic light-emitting layer, wherein the first electrode is the anode electrode and the second electrode is the cathode electrode.

* * * * *